US012792800B1

(12) United States Patent
Colwell

(10) Patent No.: US 12,792,800 B1
(45) Date of Patent: Nov. 10, 2026

(54) INTEGRATED LAWN INTELLIGENCE MANAGEMENT SYSTEM

(71) Applicant: Christopher Colwell, Albany, NY (US)

(72) Inventor: Christopher Colwell, Albany, NY (US)

( * ) Notice: Subject to any disclaimer, the term of this patent is extended or adjusted under 35 U.S.C. 154(b) by 0 days.

(21) Appl. No.: 19/558,615

(22) Filed: Mar. 6, 2026

(51) Int. Cl.
*G06F 30/27* (2020.01)
*A01C 21/00* (2006.01)
*A01G 25/16* (2006.01)

(52) U.S. Cl.
CPC ............ *G06F 30/27* (2020.01); *A01C 21/007* (2013.01); *A01G 25/165* (2013.01)

(58) Field of Classification Search
CPC ...... G06F 30/27; A01C 21/007; A01G 25/165
See application file for complete search history.

(56) References Cited

U.S. PATENT DOCUMENTS

2019/0318434 A1* 10/2019 Avey .................... A01C 21/007
2020/0074023 A1* 3/2020 Nizami ................ A01B 79/005
2023/0034493 A1* 2/2023 Motycka .............. A01G 25/167
2025/0053884 A1* 2/2025 Shah ...................... G06N 20/20

FOREIGN PATENT DOCUMENTS

IN 202541056468 A * 6/2025 ............ A01B 79/00

* cited by examiner

*Primary Examiner* — Chuen-Meei Gan
(74) *Attorney, Agent, or Firm* — Shore IP Group, PLLC; Sean R. Wilsusen

(57) ABSTRACT

A lawn intelligence management system integrates satellite imagery, soil diagnostics, weather forecasting, and adaptive machine learning to automate lawn care. The system includes a processor and memory storing instructions that receive aerial imagery to generate a digital lawn map defining management zones based on image-derived features. Soil data for each zone, including nutrient composition and pH, are analyzed by a predictive soil-correction model that determines nutrient adjustments using historical data, weather inputs, and prior treatments. A dynamic fertilizer-optimization algorithm computes zone-specific application parameters within predefined nutrient thresholds. Weather forecasts are used to generate action alerts recommending irrigation or fertilization, and corresponding control signals are transmitted to an irrigation subsystem. Feedback from soil updates, imagery changes, or user confirmations continuously refines a machine-learning model, enabling adaptive, data-driven optimization of watering and fertilization schedules for efficient, self-improving lawn management.

20 Claims, 9 Drawing Sheets

700

INTEGRATED LAWN INTELLIGENCE MANAGEMENT SYSTEM

FIELD

The present disclosure relates to automated lawn-care systems and methods. More particularly, it pertains to computer-implemented techniques for mapping, analyzing, and controlling lawn maintenance through the integration of satellite imagery, soil diagnostics, weather forecasting, and adaptive machine learning.

BACKGROUND

Conventional lawn maintenance relies on fixed schedules and manual observation, often leading to inefficient watering, fertilizer overuse, and inconsistent turf health. Although certain irrigation controllers incorporate limited weather awareness, they fail to account for spatial soil variation, nutrient composition, or dynamic environmental changes. Existing systems lack the ability to learn from prior outcomes and tailor zone-specific recommendations over time.

There remains a need for an intelligent, data-driven lawn management platform that combines satellite imaging, soil chemistry, environmental forecasting, and adaptive analytics to optimize nutrient and water delivery automatically while continuously improving performance through feedback learning.

SUMMARY

The present disclosure relates to automated lawn-care systems and methods. More particularly, it pertains to computer-implemented techniques for mapping, analyzing, and controlling lawn maintenance through the integration of satellite imagery, soil diagnostics, weather forecasting, and adaptive machine learning.

Provided in accordance with aspects of the present disclosure is a lawn intelligence management system. The system includes a processor and a memory storing computer-executable instructions that, when executed by the processor, cause the system to access imagery data corresponding to a geographic region from at least one satellite or aerial imagery source, generate a digital lawn map of the geographic region based on the imagery data including automatically identifying lawn boundaries and subdividing the lawn into a plurality of management zones based on one or more image-derived characteristics, receive soil data associated with at least one of the management zones, the soil data including nutrient composition, macro and micronutrient composition, and pH level, determine corrective actions for the soil data using a soil-correction model that predicts nutrient adjustments for each management zone based on historical soil data, weather data, and applied treatments, compute fertilizer application parameters for each management zone using a dynamic fertilizer-optimization algorithm configured to maintain nutrient ratios within predefined thresholds, determine one or more action alerts based on weather forecast data, the one or more action alerts including watering or fertilization actions based on predicted temperature, precipitation, and evapotranspiration conditions, control or transmit control signals to an irrigation subsystem to adjust watering schedules in response to the action alerts and the fertilizer application parameters, and update a user-specific machine-learning model using feedback data including soil condition updates, imagery changes, or user confirmations, wherein the model refines subsequent soil corrections and watering schedules based on the feedback data.

In aspects, generating the digital lawn map may include applying perspective correction and contrast normalization to the imagery data prior to identifying the lawn boundaries.

In aspects, subdividing the lawn into management zones may include performing image segmentation using vegetation-index values computed from multispectral imagery.

In aspects, the soil-correction model may generate predicted nutrient trajectories using time-series forecasting and may dynamically adjust corrective recommendations in response to changing weather forecasts.

In aspects, the dynamic fertilizer-optimization algorithm may employ constraint-based optimization to maintain target nitrogen-phosphorus-potassium ratios while minimizing total fertilizer mass.

In aspects, the action alerts may be prioritized according to a calculated lawn-stress index derived from weather and soil-moisture variables.

In aspects, the system may further include a user interface configured to display the digital lawn map with overlaid management zones, soil parameters, and recommended actions.

In aspects, the machine-learning model may implement reinforcement learning that rewards nutrient uniformity and penalizes excess water or fertilizer application over time.

Provided in accordance with aspects of the present disclosure is a computer-implemented method for managing lawn care. The method includes accessing imagery data corresponding to a geographic region from at least one satellite or aerial imagery source, generating a digital lawn map of the geographic region based on the imagery data including automatically identifying lawn boundaries and subdividing the lawn into a plurality of management zones based on one or more image-derived characteristics, receiving soil data associated with at least one of the management zones including nutrient composition and pH level, determining corrective actions for the soil data using a soil-correction model that predicts nutrient adjustments for each management zone based on historical soil data, weather data, and applied treatments, computing fertilizer application parameters for each management zone using a dynamic fertilizer-optimization algorithm configured to maintain nutrient ratios within predefined thresholds, receiving weather forecast data and determining one or more action alerts including watering or fertilization actions based on predicted temperature, precipitation, and evapotranspiration conditions, controlling or transmitting control signals to an irrigation subsystem to adjust watering schedules in response to the action alerts and fertilizer application parameters, and updating a user-specific machine-learning model using feedback data including soil condition updates, imagery changes, or user confirmations, wherein the model refines subsequent soil corrections and watering schedules based on the feedback data.

In aspects, the method may further include displaying the digital lawn map with visual overlays identifying the management zones and corresponding nutrient or moisture levels.

In aspects, generating the digital lawn map may include performing image segmentation based on normalized difference vegetation index values derived from the imagery data.

In aspects, determining corrective actions may include executing a predictive model trained on historical lawn datasets to forecast nutrient imbalance and recommend application timing.

In aspects, the method may further include receiving real-time soil-moisture sensor data from a plurality of in-ground probes and incorporating the data into the determination of the action alerts.

In aspects, computing fertilizer application parameters may include optimizing nutrient concentration values under environmental compliance constraints to reduce runoff potential.

In aspects, the method may further include automatically scheduling an irrigation event when an upcoming weather forecast exceeds a threshold heat index and soil moisture is below a defined value.

In aspects, updating the machine-learning model may include adjusting feature weights according to measured outcomes of prior fertilizer and irrigation actions.

In aspects, the user-specific machine-learning model may be trained using reinforcement signals representing lawn color uniformity, soil-nutrient stability, and water-use efficiency.

In aspects, the method may further include generating a lawn-health score for each management zone based on combined imagery, soil, and weather features and using the score to trigger the action alerts.

In aspects, determining the action alerts may include ranking potential actions by predicted improvement in the lawn-health score relative to resource consumption.

Provided in accordance with aspects of the present disclosure is a non-transitory computer-readable medium. The medium stores computer-executable instructions that, when executed by one or more processors, cause a computing system to perform a method including accessing imagery data corresponding to a geographic region from at least one satellite or aerial imagery source, generating a digital lawn map of the geographic region based on the imagery data including automatically identifying lawn boundaries and subdividing the lawn into a plurality of management zones based on one or more image-derived characteristics, receiving soil data associated with at least one of the management zones including nutrient composition and pH level, determining corrective actions for the soil data using a soil-correction model that predicts nutrient adjustments for each management zone based on historical soil data, weather data, and applied treatments, computing fertilizer application parameters for each management zone using a dynamic fertilizer-optimization algorithm configured to maintain nutrient ratios within predefined thresholds, receiving weather forecast data and determining one or more action alerts including watering or fertilization actions based on predicted temperature, precipitation, and evapotranspiration conditions, controlling or transmitting control signals to an irrigation subsystem to adjust watering schedules in response to the action alerts and fertilizer application parameters, and updating a user-specific machine-learning model using feedback data including soil condition updates, imagery changes, or user confirmations, wherein the model refines subsequent soil corrections and watering schedules based on the feedback data. BRIEF

DESCRIPTION OF THE DRAWINGS

Various aspects and features of the present disclosure are described hereinbelow with reference to the drawings wherein.

DETAILED DESCRIPTION

Figure 1:
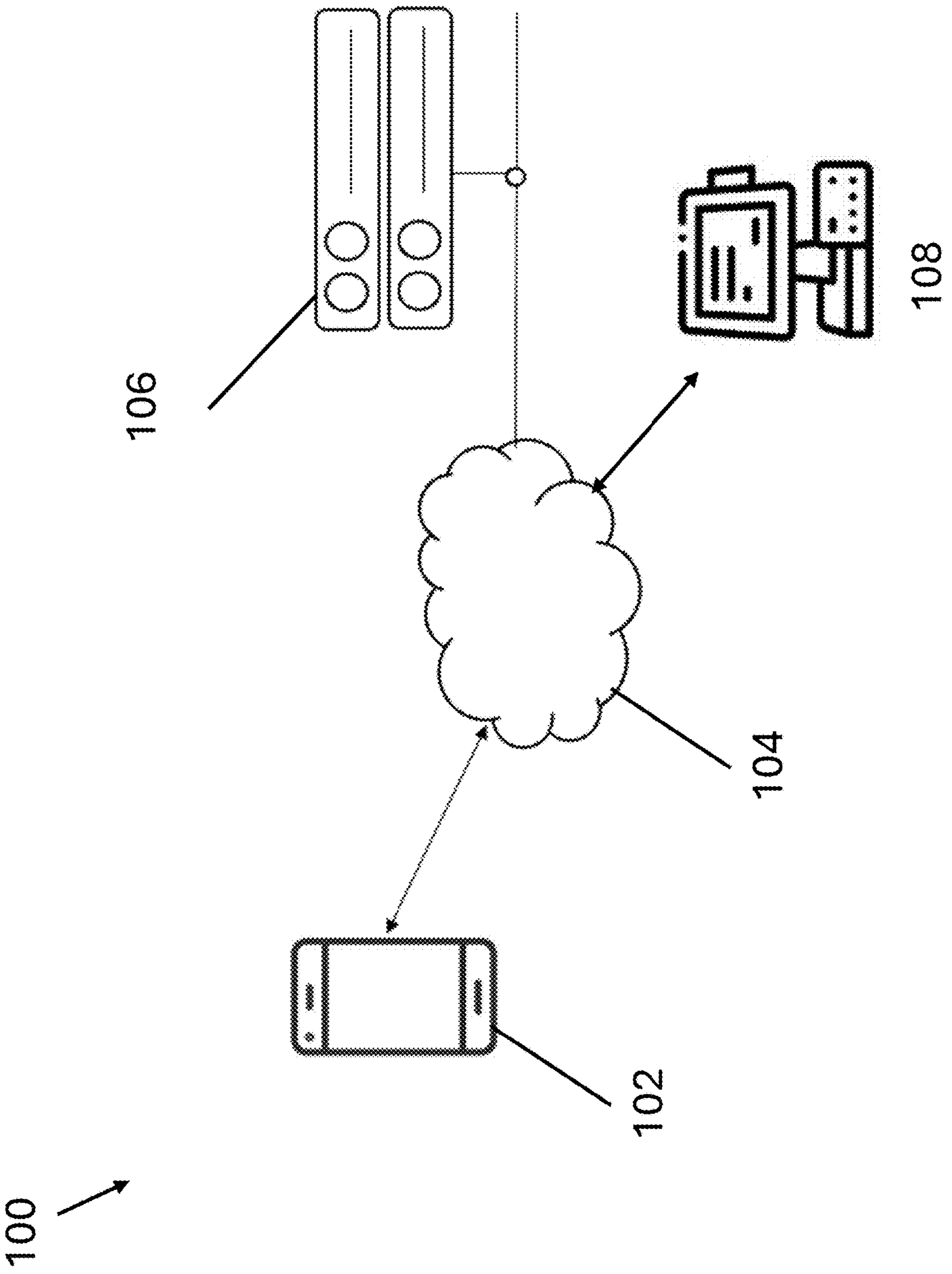
FIG. 1 is a block diagram of an architecture for a system for managing lawn care, according to aspects of the present disclosure.

Descriptions of technical features or aspects of an exemplary configuration of the disclosure should typically be considered as available and applicable to other similar features or aspects in another exemplary configuration of the disclosure. Accordingly, technical features described herein according to one exemplary configuration of the disclosure may be applicable to other exemplary configurations of the disclosure, and thus duplicative descriptions may be omitted herein.

Exemplary configurations of the disclosure will be described more fully below (e.g., with reference to the accompanying drawings). Like reference numerals may refer to like elements throughout the specification and drawings.

The present disclosure relates to automated lawn-care systems and methods. More particularly, it pertains to computer-implemented techniques for mapping, analyzing, and controlling lawn maintenance through the integration of satellite imagery, soil diagnostics, weather forecasting, and adaptive machine learning.

Referring particularly to FIG. 1, a lawn intelligence management system 100 generally includes a mobile device 102 (e.g., a first user device), a home computer, a server 106, a laptop, and/or a tablet in network 104 communication with a second user device 108. The mobile device 102, a home computer, a server 106, a laptop, and/or a tablet may be a general-purpose computer 200 (e.g., a processor), of FIG. 2, configured for network 104 communications. Portions of system 100 may operate as an application for lawn intelligence management installed on one user device.

The disclosed technology provides a computer-implemented lawn intelligence management system that automatically integrates satellite or aerial imagery, soil diagnostics, and weather forecasts into a unified digital model of a user's property. The system employs a soil-correction engine and a fertilizer optimization algorithm to calculate precise nutrient ratios for each defined management zone, while a weather-adaptive control module generates real-time action alerts for irrigation and fertilization. A machine-learning component continuously refines predictive models based on historical outcomes, user interactions, and environmental feedback, thereby improving accuracy and efficiency over time. By combining heterogeneous data sources through adaptive computation, the technology solves the problem of disconnected and static lawn care processes by delivering a self-optimizing, data-driven solution that adjusts dynamically to local conditions.

Figure 2:
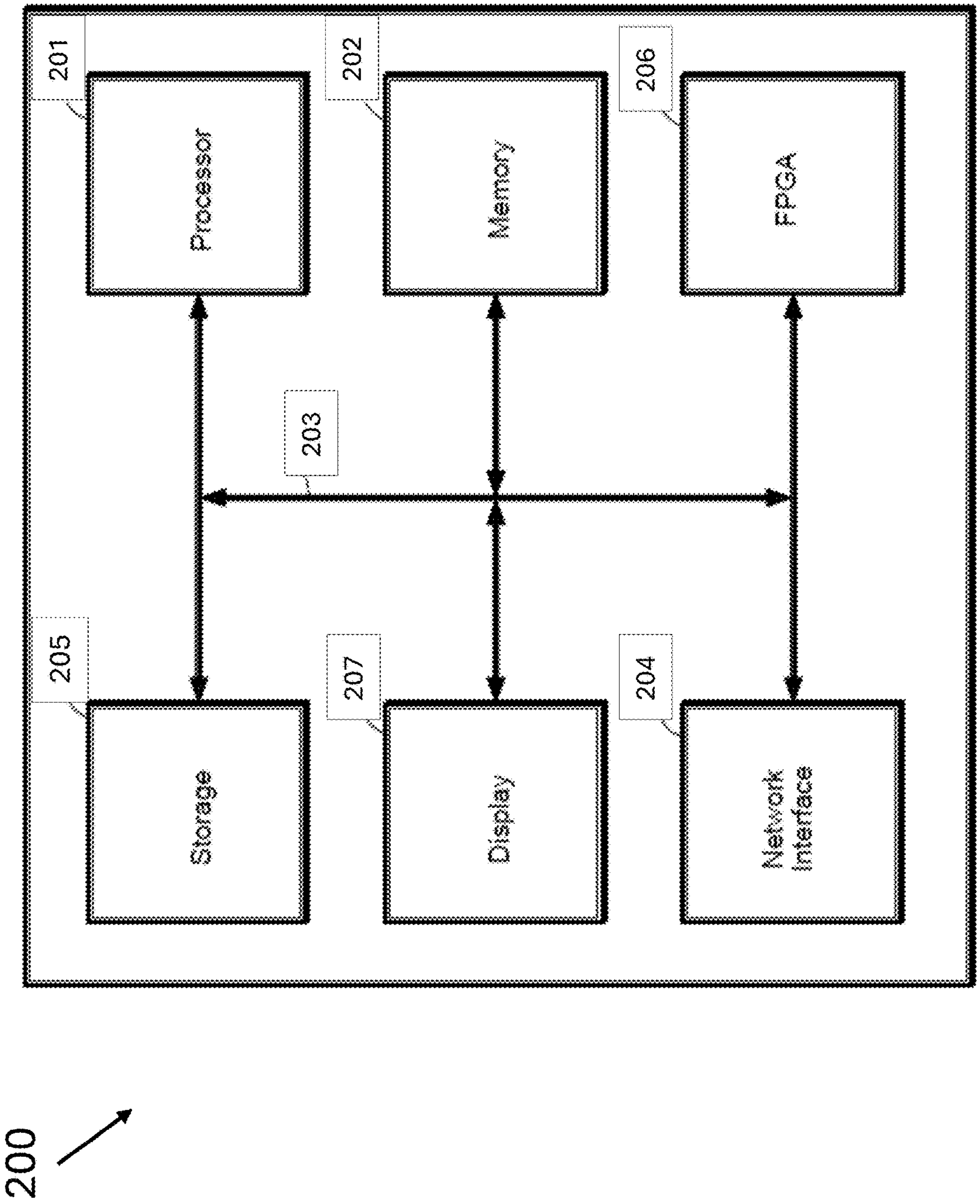
FIG. 2 is a block diagram of the system of FIG. 1 according to aspects of the present disclosure.

Referring to FIG. 2, the general-purpose computer 200 employable by system 100 is described. The computer 200 may include a processor 201 connected to a computer-readable storage medium or a memory 202 which may be a volatile type memory, e.g., RAM, or a non-volatile type memory, e.g., flash media, disk media, etc. The processor 201 may be another type of processor such as, without limitation, a digital signal processor, a microprocessor, an ASIC, a graphics processing unit (GPU), field-programmable gate array (FPGA), or a central processing unit (CPU). General-purpose computer 200, for example may include a mobile device such as a cell phone or a tablet.

In some aspects of the disclosure, the memory 202 can be random access memory, read-only memory, magnetic disk memory, solid state memory, optical disc memory, and/or another type of memory. The memory 202 can communicate with the processor 201 through communication buses 203 of a circuit board and/or through communication cables such as serial ATA cables or other types of cables. The memory 202 includes computer-readable instructions that are executable by the processor 201 to operate the computer 200 to execute the various functions described herein. The computer 200 may include a network interface 204 to communicate (e.g., through a wired or wireless connection) with other computers or a server. A storage device 205 may be used for storing data. The computer 200 may include one or more FPGAs 206. The FPGAs 206 may be used for executing various functions described herein. A display 207 may be employed to display data processed by the computer 200.

As will be appreciated by one skilled in the art, aspects of the present disclosure may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module," "unit" or "system." Furthermore, aspects of the present disclosure may take the form of a computer program product embodied in one or more computer readable medium(s) having computer readable program code embodied thereon. If implemented in software, the functions may be stored on or transmitted over as one or more instructions or code on a tangible, non-transitory computer-readable medium.

Herein, the term "circuit" may refer to an analog circuit or a digital circuit. In the case of a digital circuit, the digital circuit may be hard-wired to perform the corresponding tasks of the circuit, such as a digital processor that executes instructions to perform the corresponding tasks of the circuit. Examples of such a processor include an application-specific integrated circuit (ASIC) and a field-programmable gate array (FPGA).

Figure 3:
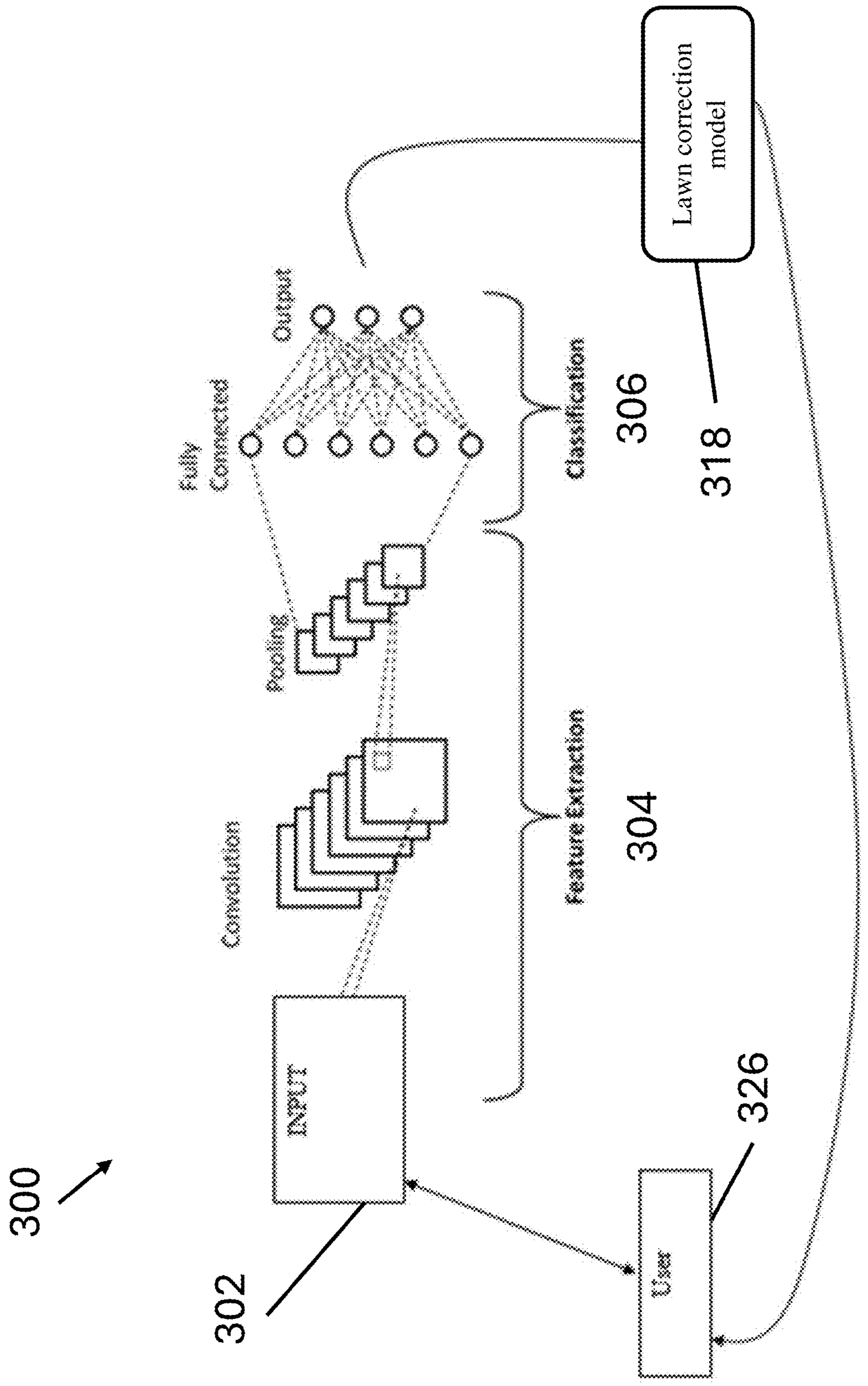
FIG. 3 is a schematic illustration of a convolutional neural network employable by the system of FIG. 1, according to aspects of the present disclosure.

FIG. 3 is a schematic illustration of a convolutional neural network (CNN) employable by the machine learning model 300 of FIG. 1 according to aspects of the present disclosure.

In CNNs, feature extraction 304 is the process of automatically identifying relevant patterns from input data, which may include aerial or satellite images, multispectral bands, or structured environmental data. The feature extraction 304 function is performed by convolutional layers composed of filters that traverse the input and produce feature maps highlighting distinct characteristics. For image data, these filters may detect edges, textures, or vegetation patterns. Through iterative training, the CNN 300 adjusts filter weights to extract features that best represent predictive attributes relevant to downstream processing modules within system 100.

Following feature extraction, pooling 306 is performed as a down-sampling operation to reduce the dimensionality of the generated feature maps. The pooling 306 operation summarizes information within local neighborhoods of the feature maps, preserving essential data characteristics while improving computational efficiency. A commonly used pooling method is max pooling, which retains the highest activation value within each defined region. This process enhances the model's robustness to minor variations in input data, such as small behavioral fluctuations or time-dependent noise, thereby preventing overfitting and improving generalization. Repeated application of feature extraction 304 and pooling 306 layers enables the CNN 300 to form a hierarchical internal representation of the data, learning abstract features that correspond to complex behavioral or semantic patterns across the integrated data sources.

After the pooling operation, the transformed data is passed into one or more fully connected layers functioning as classifiers 308. The classifiers 308 interpret the high-level features and map them to predictive categories or probability distributions. During training, parameters associated with the classifiers 308 are optimized using backpropagation and gradient descent to minimize loss between predicted values and known training targets. In some embodiments, the final layer of the CNN 300 applies a softmax activation to produce a probability vector corresponding to predicted lawn conditions or zone-level outcomes.

For example, when the CNN 300 processes environmental and imagery data obtained through the imagery analysis module and soil-data integration module, it may generate output values representing predicted indicators of lawn health for each management zone. These output values may include probabilities or confidence scores associated with conditions such as nutrient deficiency, overwatering, or drought stress. The CNN-derived predictions are transmitted to a lawn correction model 318, which interprets them as actionable health metrics. The lawn correction model 318 then uses this information to perform adaptive optimization processes, such as adjusting fertilizer dosage, modifying irrigation schedules, or prioritizing corrective treatments for zones exhibiting the greatest predicted stress. Through iterative feedback and retraining, the CNN 300 continuously improves its predictive accuracy, enabling more precise and responsive lawn-management decisions over time.

In aspects, the CNN 300 may be trained on soil tests. In aspects, the CNN 300 may provide improved OCR accuracy through neural network training. In aspects, the CNN 300 may enable automatic handwriting recognition for hand-filled test forms.

In aspects, the CNN 300 may forecast when next soil test is needed, predict nutrient depletion based on application history, estimate time-to-optimal based on correction plan, and/or disease susceptibility predictions based on nutrient imbalances.

Figure 4:
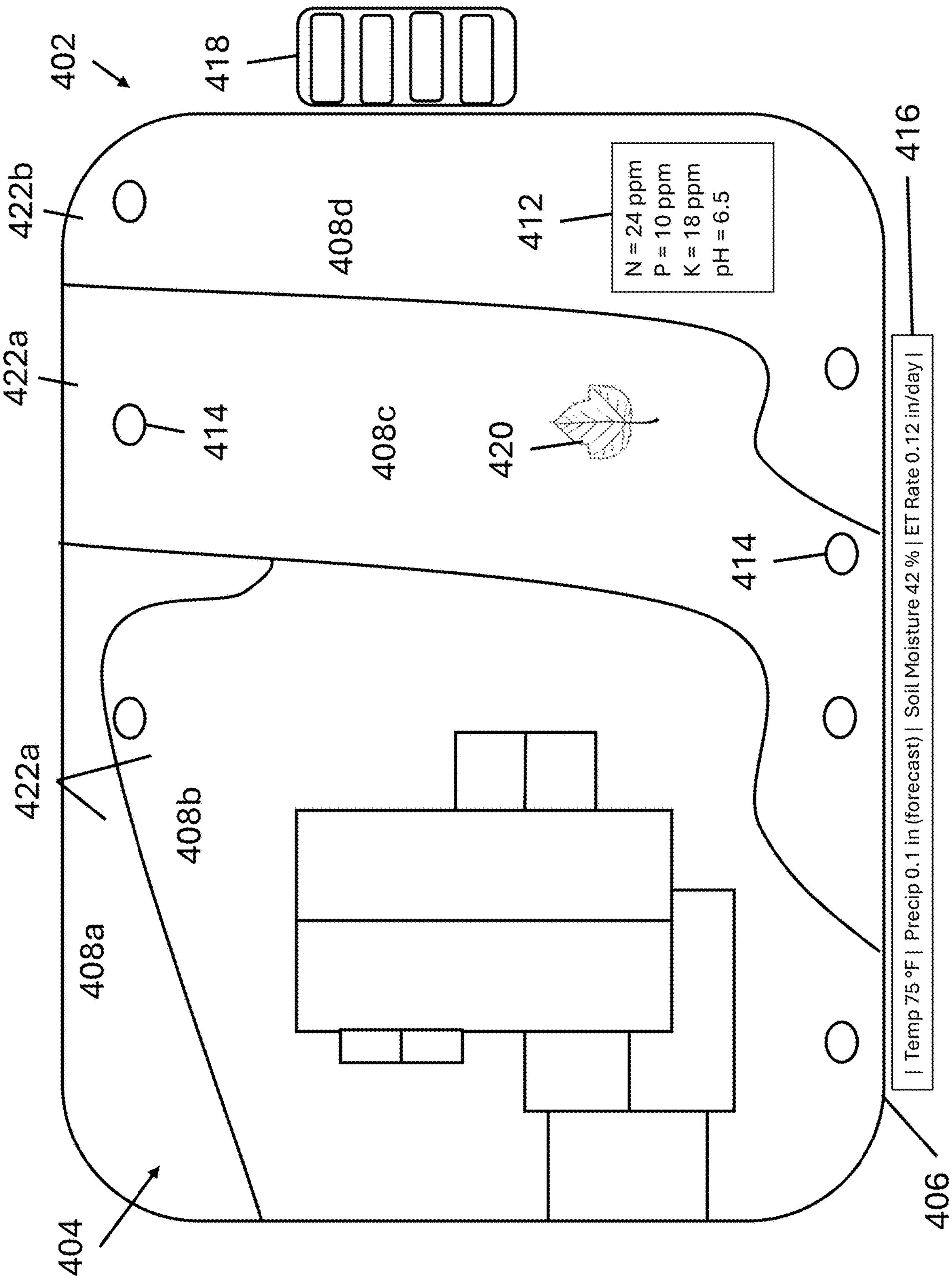
FIG. 4 is an illustrative user interface displaying a digital lawn map with overlaid management zones and corresponding soil and environmental parameters, according to aspects of the present disclosure.

FIG. 4 illustrates an example graphical user interface 400 of an intelligent lawn-management application. The interface may be executed on a computing device such as a smartphone, tablet, or web-based dashboard and provides real-time visualization and interaction with the lawn intelligence management system.

The interface includes a display window 402 that presents a digital lawn map 404 generated from satellite, aerial, or drone imagery of the user's property. The digital lawn map is rendered using geographic coordinate data and may be stored in a georeferenced format such as GeoTIFF, shapefile, KML, or other digital format. The map displays lawn boundary lines 406 that delineate the property perimeter. In aspects, the system may generate these boundaries automatically by detecting edge transitions between vegetation and non-vegetation regions using contour extraction, Canny edge detection, or semantic segmentation techniques applied to vegetation index layers.

Within the property, internal management zones 408*a*-408*d* are visually distinguished using different colors, transparency levels, or pattern overlays. Each management zone corresponds to a region with relatively uniform vegetation index values, soil composition, or irrigation characteristics. In aspects, the system may define these zones through a clustering algorithm such as k-means or DBSCAN applied to pixel-level vegetation features. The zones may further be refined based on slope, sunlight exposure, or user feedback.

Each zone is labeled with a zone identifier 410*a*-410*d* and linked to an associated soil-data panel 412. These panels may display quantitative data such as nitrogen (N), phosphorus (P), and potassium (K) concentrations, soil pH, organic matter percentage, and moisture content. In aspects, the system may retrieve these values from a cloud database storing results of laboratory soil tests or from real-time sensor readings transmitted by in-ground probes. The displayed values may include historical trends, uncertainty indicators, and time since last measurement.

Overlay icons 414 may represent physical assets, including irrigation heads, soil-moisture probes, or fertilizer dispensers. These icons are positioned based on geospatial coordinates collected during system setup or device calibration. In aspects, the system may allow users to select an icon to view real-time operational data, such as irrigation flow rate, battery status, or the last activation timestamp.

A status bar 416 presents environmental metrics including ambient temperature, precipitation probability, forecast evapotranspiration rate, and average soil moisture across all zones. The system may retrieve weather forecast data through an integrated API and update these values periodically.

A control menu 418 enables user actions such as "view actions," "edit zones," "run analysis," and "manual override." In aspects, "view actions" may open a list of upcoming irrigation or fertilization tasks generated by the decision engine. "Edit zones" may allow boundary reshaping through touch or drag input. "Run analysis" may trigger reprocessing of the latest imagery, while "manual override" temporarily disables automation and allows direct user control of irrigation events.

In aspects, the system enables the tracking of at least thirteen soil parameters, including: pH Level (optimal: 6.0-7.0), Macronutrients: Nitrogen (N), Phosphorus (P), Potassium (K), Secondary Nutrients: Calcium (Ca), Magnesium (Mg), Sulfur(S), and/or Micronutrients: Iron (Fe), Manganese (Mn), Zinc (Zn), Copper (Cu), Boron (B) o Sodium (Na) for salinity issues. In aspects, the system enables parts-per-million (ppm) measurement tracking, percentage-of-optimal calculations and/or visual bar chart showing deficiencies/excesses. Secondary Nutrients may be referred to as secondary macros and micro-nutrients.

Alert indicators 420 may appear adjacent to zones requiring attention. For instance, a red droplet may signal low soil moisture, while a yellow leaf icon may indicate a nutrient deficiency. In aspects, the system may compute alert priority based on a composite lawn health index, which integrates vegetation vigor, nutrient deviation, and forecast stress conditions. The user interface thus functions as a dynamic visualization platform linking geospatial analytics, soil diagnostics, and automated control feedback in real time. In aspects, the system may include a group of management zones 422*a*, 422*b*. For example, the group of management zones 422*a* may include internal management zones 408*a-c*, and group of management zones 422*b* may include individual zones 408*d-f*.

Figure 5:
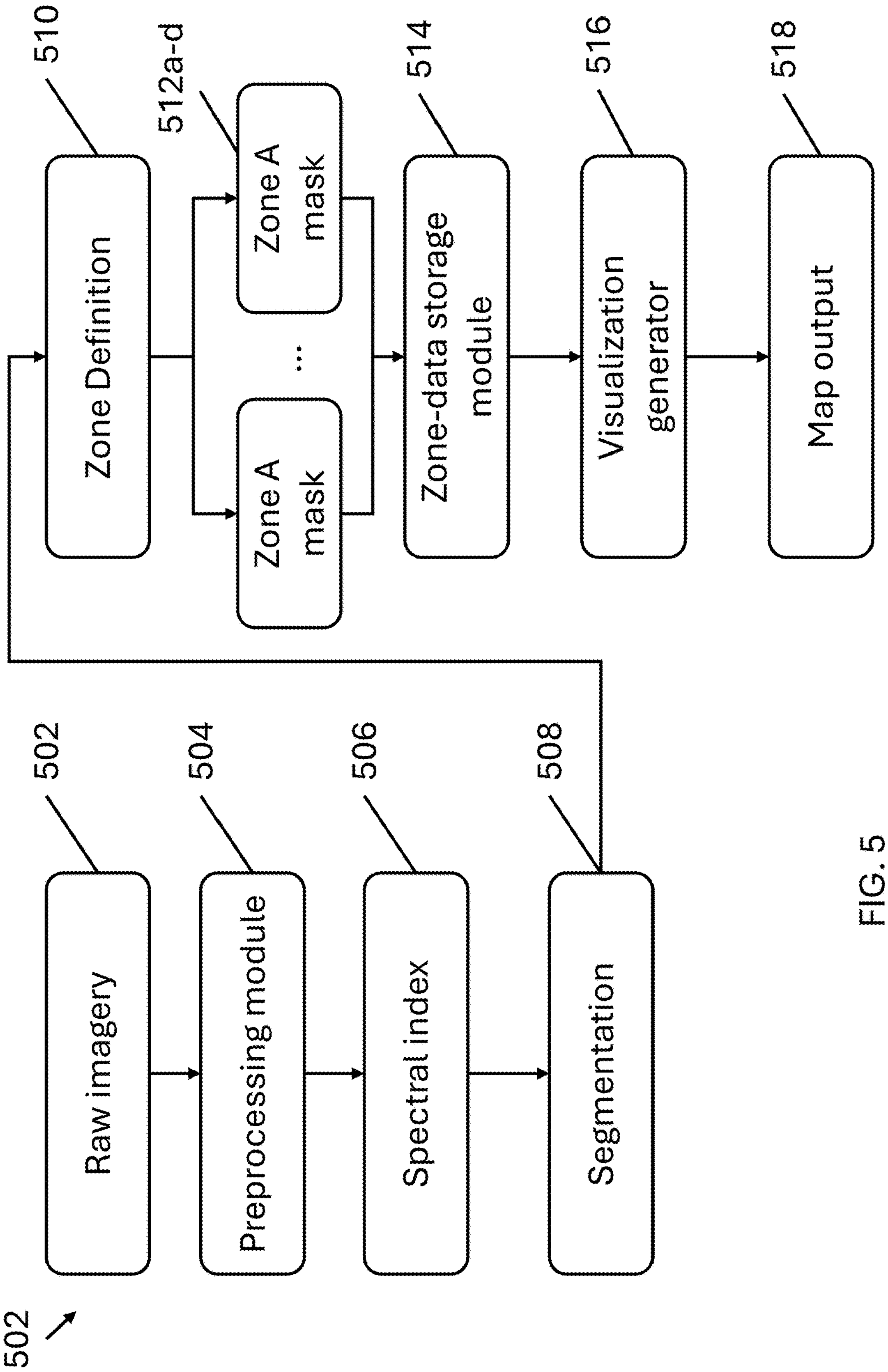
FIG. 5 is a flow diagram illustrating an example process for generating a digital lawn map and subdividing imagery into management zones, according to aspects of the present disclosure.

FIG. 5 depicts an example image-processing pipeline 500 implemented by the system for generating a digital lawn map and subdividing imagery into management zones.

At step 502, the system receives raw imagery data from one or more satellite or aerial imaging sources. The imagery may include RGB, multispectral, or hyperspectral bands with georeferencing metadata. In aspects, the system may preprocess imagery to align coordinate systems with known ground reference points such as building corners or lot boundaries.

At step 504, a preprocessing module performs perspective correction and contrast normalization. Perspective correction may be achieved through homography transformation using matched feature points derived from a structure-from-motion algorithm or corner detectors such as SIFT or ORB. Contrast normalization may apply adaptive histogram equalization to enhance vegetation contrast, particularly in shaded or overexposed areas. In aspects, the system may further remove cloud or shadow artifacts using threshold-based shadow detection on near-infrared intensity maps.

At step 506, the system calculates one or more spectral vegetation indices. The normalized difference vegetation index (NDVI) is commonly used, computed as (NIR−Red)/(NIR+Red). Additional indices such as the Green NDVI (GNDVI), Soil-Adjusted Vegetation Index (SAVI), or Normalized Difference Water Index (NDWI) may also be computed to improve classification robustness. These indices quantify vegetation vigor and are normalized to a 0-1 scale for comparison across images.

At step 508, the segmentation engine performs image segmentation to separate vegetation regions from non-vegetation features such as pavement, structures, or bare soil. In aspects, the system may employ an unsupervised clustering algorithm such as k-means to partition pixels by vegetation index value, or a deep convolutional neural network trained on labeled aerial datasets to achieve semantic segmentation. The CNN may use architectures such as U-Net or DeepLabV3+ optimized for small-object detection at lawn scale.

At step 510, a zone-definition module groups contiguous pixel regions with similar spectral and textural properties into management zones. In aspects, the system may compute texture features such as local entropy or gray-level co-occurrence matrix statistics to capture subtle differences in turf density or stress. The module generates polygonal zone masks 512*a*-512*d*, assigns identifiers, and calculates zone-level summary statistics including average NDVI, vegetation variance, and soil-moisture index.

At step 514, a zone-data storage module saves the processed imagery, boundaries, and metadata to a digital lawn-map database. The database schema may include geospatial polygons, soil chemistry attributes, vegetation indices, and temporal references to facilitate historical trend analysis.

At step 516, a visualization generator creates map output 518 for display on the user interface shown in FIG. 4. The generator overlays zone polygons, color-coded NDVI values, and sensor locations on the base imagery. In aspects, the system may render the map using a WebGL-based visualization framework, allowing zoom, rotation, and data-layer toggling in real time.

In aspects, the system may employ alternate segmentation methods such as graph-based partitioning, Markov random field optimization, or attention-based deep-learning models to improve precision in heterogeneous lawn conditions. The image-processing pipeline thus converts raw imagery into structured, data-rich lawn representations usable for targeted nutrient and irrigation control.

Figure 6A:
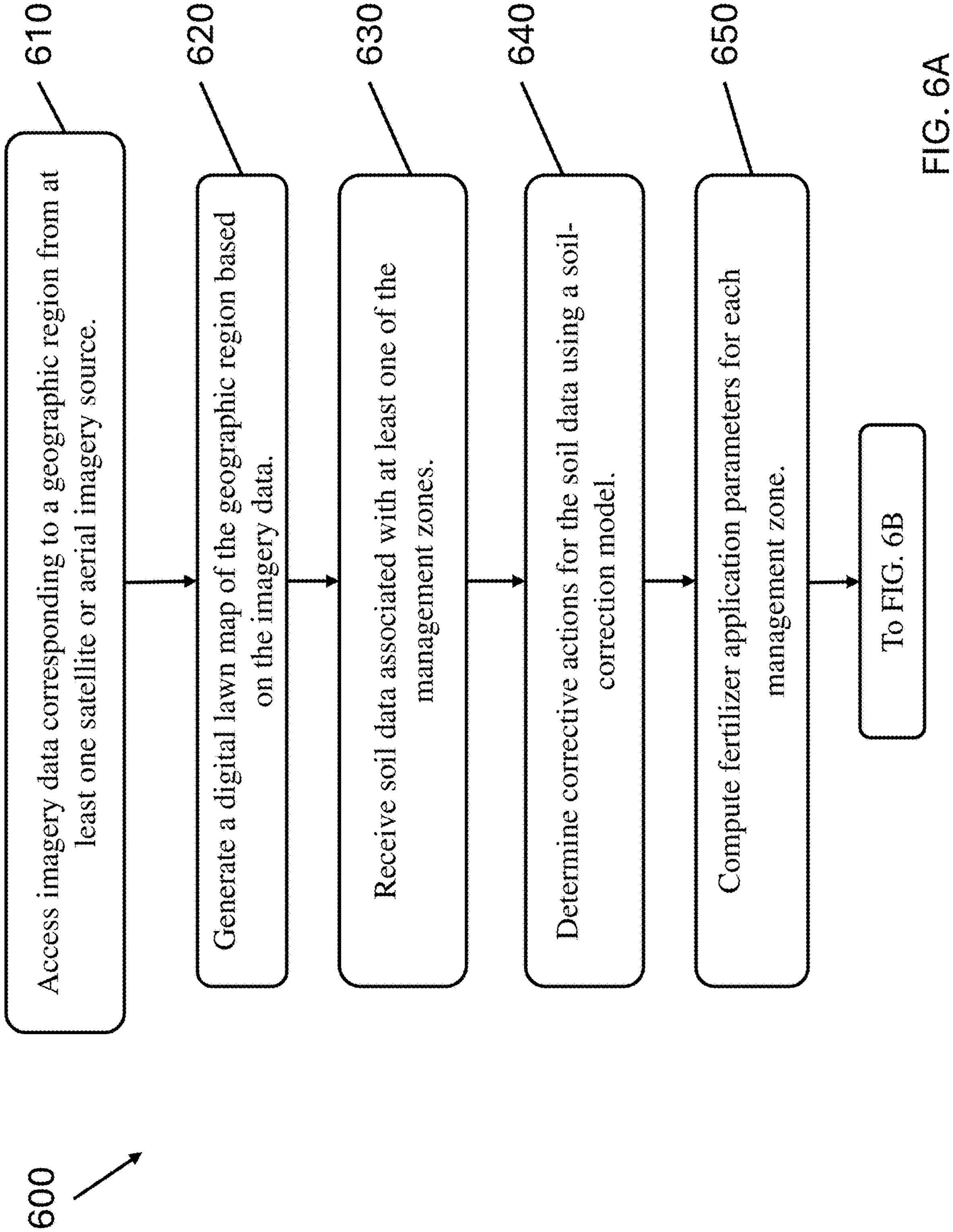
FIGS. 6A-6B are flow charts for a method for a system for managing lawn care, according to aspects of the present disclosure.
Figure 6B:
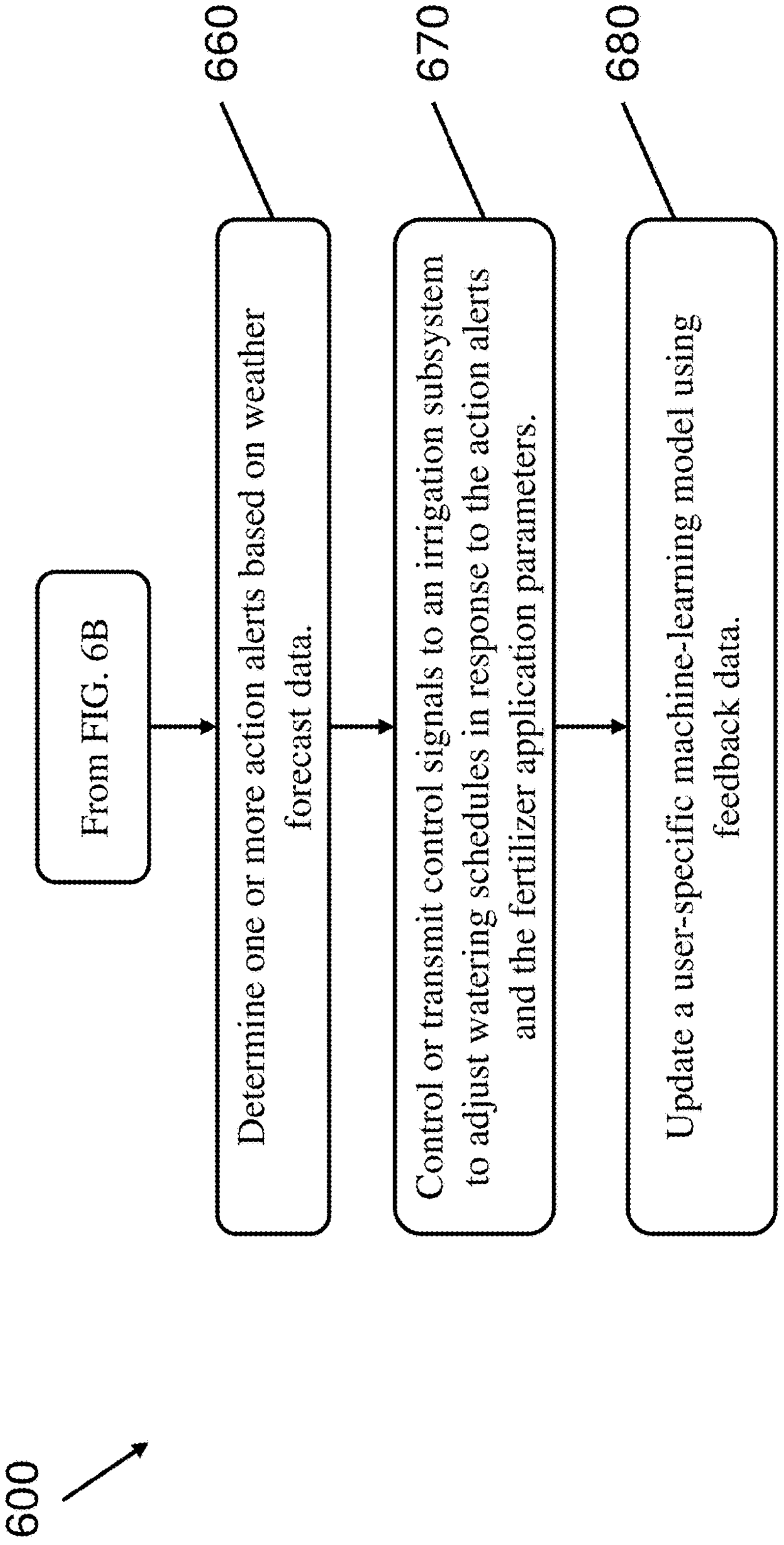

With reference to FIGS. 6A-6B, a flowchart 600 illustrating an example method for lawn intelligence management using system 100 of FIG. 1 is shown. The method 600 may be performed by the processor 200 of FIG. 2. Portions of the method 600 may be performed by a separate device, such as a server. Although the steps are shown in a particular sequence, the operations may occur concurrently, iteratively, or in a different order depending on data availability, system configuration, or processing load.

At operation 610, the system accesses imagery data corresponding to a geographic region from at least one satellite or aerial source. In aspects, the system may connect to a satellite-imagery API, for example, Google Earth, MapBox, Sentinel-2 or PlanetScope, to retrieve a 10-meter-resolution multispectral image covering the property coordinates. The image may include visible (red, green, blue) and near-infrared bands. In aspects, the system may accept drone-captured imagery uploaded by the user, using embedded GPS data to align coordinates.

At operation 620, the system generates a digital lawn map of the region. The image is orthorectified and processed to identify vegetation boundaries. A vegetation mask is computed using NDVI thresholds such as NDVI greater than 0.3. The property outline is extracted by finding the largest contiguous vegetation region within the user-selected parcel. The system subdivides the lawn into management zones using k-means clustering on per-pixel NDVI and hue values, producing, for example, four zones: zone 1 (front lawn), dense vegetation, NDVI 0.78; zone 2 (shaded corner), NDVI 0.52; zone 3 (south strip), NDVI 0.65; and zone 4 (rear slope), NDVI 0.40.

At operation 630, the system receives soil data for the zones. Soil information may include nitrogen 15 mg/kg, phosphorus 5 mg/kg, potassium 40 mg/kg, and pH 6.2, entered from a laboratory report or automatically ingested from IoT soil probes sampling every 24 hours. In aspects, the data are tagged with zone identifiers to correlate chemistry with imagery features.

At operation 640, the system determines corrective actions using a soil-correction model. The model may be implemented as a recurrent neural network that predicts nutrient depletion trajectories under forecast rainfall and prior treatment history. For example, if nitrogen concentration in zone 4 is below 10 mg/kg and rainfall is predicted within 48 hours, the model may recommend applying a slow-release nitrogen supplement equivalent to 0.5 kg nitrogen per 100 $m^2$ after rainfall to prevent leaching. The model accounts for historical outcomes by adjusting coefficients associated with soil type and rainfall intensity. In aspects, the model parameters are stored in a TensorFlow Lite module executed on the cloud server. The system may include JSON files that represent scientifically backed data for each US Department of Agriculture (USDA) hardiness zones (currently USDA 4A-8B), that applies specific historical data to calculations, timelines, lawn corrections, and documents.

At operation 650, the system computes fertilizer application parameters for each management zone using a dynamic fertilizer-optimization algorithm. The algorithm looks at the user's actual soil test, apply USDA hardiness corrections, time of year, and user's details applied to each individual zone (i.e., foot traffic, slope, sun/shade, grass type, pets, etc.), and more. The output is stored as a zone-specific prescription.

At operation 660, the system retrieves weather forecast data and determines action alerts. Forecast variables include predicted temperature 34° C. high, rainfall 0 mm for 5 days, and daily evapotranspiration 5.6 mm. Based on these inputs, the system generates an alert for zone 1: increase watering by 15 percent for the next 3 days. For zone 4, the system schedules fertilization in two days when soil moisture is expected to recover. In aspects, alerts are prioritized using a computed lawn-stress index derived from NDVI change rate and soil-moisture deviation.

At operation 670, the system transmits control signals to an irrigation subsystem. Communication may occur via a REST API or MQTT protocol to a Wi-Fi-connected irrigation controller. For the example above, the system sends a command adjusting zone 1's irrigation duration from 10 minutes to 11.5 minutes per cycle. The controller confirms execution, and this status is logged with a timestamp for model training.

At operation 680, the system updates the user-specific machine-learning model using feedback data. After 72 hours, updated NDVI imagery indicates an improvement in zone 1 (NDVI increase+0.06) and oversaturation in zone 3 (soil moisture greater than 45 percent). The reinforcement-learning agent assigns a positive reward of +1.0 to zone 1 and a penalty of −0.5 to zone 3. The model updates feature weights so that future irrigation predictions for similar heat conditions reduce watering in low-slope areas. In aspects, the feedback vector may include NDVI change, soil-nitrogen change, rainfall, and irrigation duration per zone.

Through iterative cycles, the model converges toward optimized zone-specific control strategies, enabling improved nutrient balance and reduced water usage without user intervention. In aspects, the described method may be executed in a cloud-hosted environment communicating with local field devices or in a distributed architecture where edge devices perform sensor fusion and localized control. The process represents a continuous feedback cycle integrating imagery, soil, and weather intelligence to deliver adaptive, sustainable, and optimized lawn care.

In aspects, the system may enable photo capture integration. For example, an image captured by mobile camera may be instant uploaded and used as data for the system.

Figure 7:
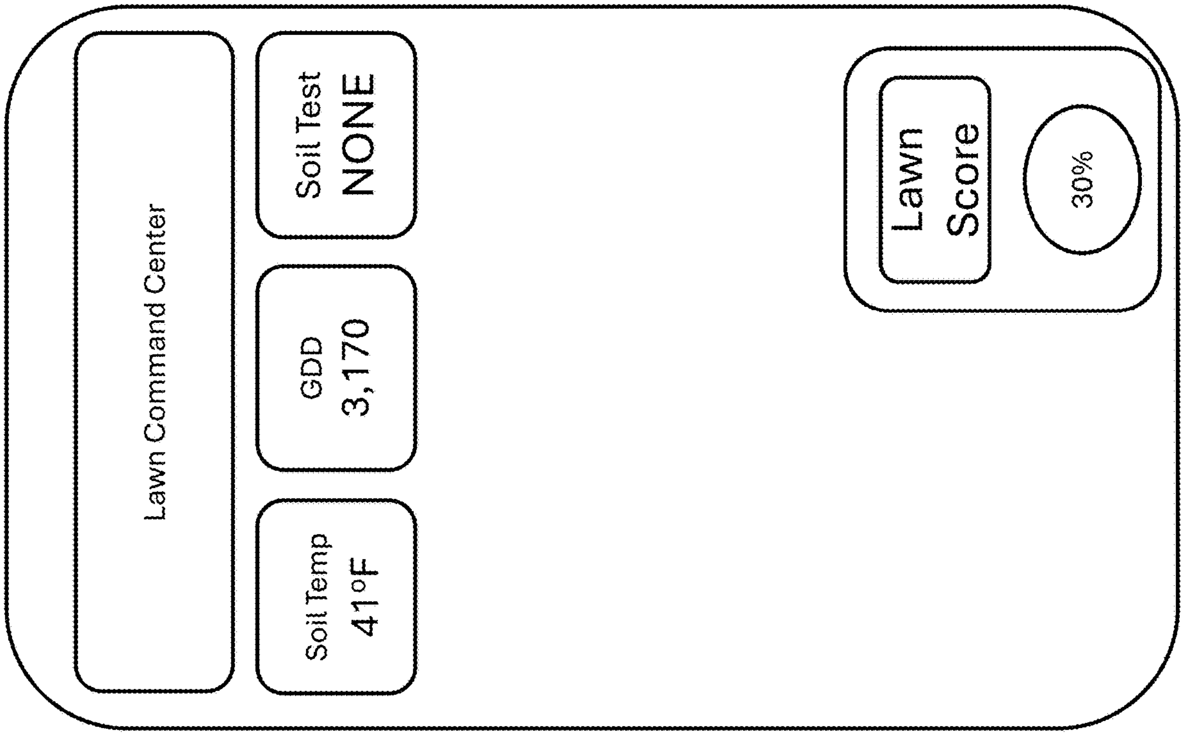
FIG. 7 is an illustrative user interface displaying a lawn command center, according to aspects of the present disclosure.

FIG. 7 illustrates an example lawn command center user interface 700 presented by the lawn intelligence management system through a client application on a user device. The lawn command center may provide a weekly task dashboard that aggregates timing intelligence, task generation, and completion tracking so a user can review recommended watering, fertilization, mowing, and treatment actions across a rolling planning window.

In aspects, the lawn command center may include a set of metric cards positioned near the top of the view. The metric cards may include a current soil temperature value representing surface soil temperature, for example, at approximately 0 cm depth, an accumulated growing degree days value calculated using a base temperature of about 50 degrees Fahrenheit, and a soil test status indicator reflecting whether a soil test has been uploaded and set as active for recommendations. The metric card area may also include additional timing references, including growing degree days computed using a second base value and soil temperature measured or estimated, for example, at an additional depth such as 6 cm, which may support timing of seasonal windows and milestone triggers. In aspects, the lawn command center may provide soil texture classification (e.g., sand/silt/clay percentages). In aspects, the system may provide organic matter decomposition timeline predictions and/or heavy metal contamination detection.

In aspects, the system may provide an automated recommendation engine configured to analyze deficiencies and generates correction plans, calculates exact amendment quantities needed, prioritizes pH correction (must be corrected first), provide application timing recommendations, and/or consider nutrient interactions (e.g., high Ca blocking Mg uptake).

In aspects, a timeline region may present tasks organized into multiple periods, which may include last week, current week, and next week. Each task entry may include a task label, a priority indicator, and a completion control such as a checkbox. A selected completion control may store a persistent completion state so the system can compute adherence statistics and may use completion outcomes as feedback when generating future tasks. The timeline region may also include filter controls that allow a user to display pending tasks, completed tasks, or tasks above a selected urgency threshold.

In aspects, the system may generate tasks using a timing engine that evaluates multiple trigger categories. The trigger categories may include soil temperature thresholds associated with agronomic timing windows, growing degree day milestone triggers used for season specific applications, USDA hardiness zone based seasonal timing, soil test derived nutrient and pH conditions that influence rate and product selection, disease or pest pressure conditions derived from temperature and humidity patterns, and seasonal condition states such as spring green up, summer stress, and fall recovery. The interface may support a task detail view that explains why a task is recommended by showing one or more triggering inputs such as the soil temperature and growing degree days values used by the determination logic. Trigger events may include weeds, precipitation, ET, collegiate backed turf research, irrigation events, and mowing schedules.

In aspects, the lawn command center may include a lawn score indicator that represents adherence to the recommended plan, for example, as a percentage from 0 to 100 based on completed versus total tasks within a defined period. The lawn score may be computed using weighted completion so that higher urgency tasks contribute more to the score than lower urgency tasks.

In aspects, the priority indicator may use multiple urgency levels, which may include Emergency, Critical, Urgent, High, Medium, and Low. Priority levels may escalate as an application window approaches its end or when forecast conditions increase predicted lawn stress. The system may also maintain progress counters that summarize completed versus pending tasks in the active period.

In aspects, the lawn command center may be supported by stored task records and cached timing variables such as soil temperature and growing degree days so the interface can render quickly and remain consistent across devices. The system may regenerate the task timeline on a schedule, so recommendations remain current when weather or soil conditions change.

In aspects, the application may include a notification layer coupled to the lawn command center. The notification layer may deliver weekly digest messaging listing upcoming high priority tasks and may deliver time sensitive reminders prior to the close of application windows. The system may send reminders through one or more channels including email, SMS, or in-app notifications. The system may also support two-way task completion through messaging, where a user response may update stored completion state for one or more tasks.

In aspects, the lawn command center may integrate additional workflow features. These features may include weather based task rescheduling when forecast rain, wind, or temperature extremes indicate postponement, task streak tracking that records consecutive periods of high adherence, product inventory integration that cross references upcoming tasks with a products module and may prompt acquisition of required materials, photo proof of completion capture with timestamped storage, sharing of task lists with family members or contractors using role based completion permissions, and voice assistant integration for spoken task review and completion logging.

Figure 8:
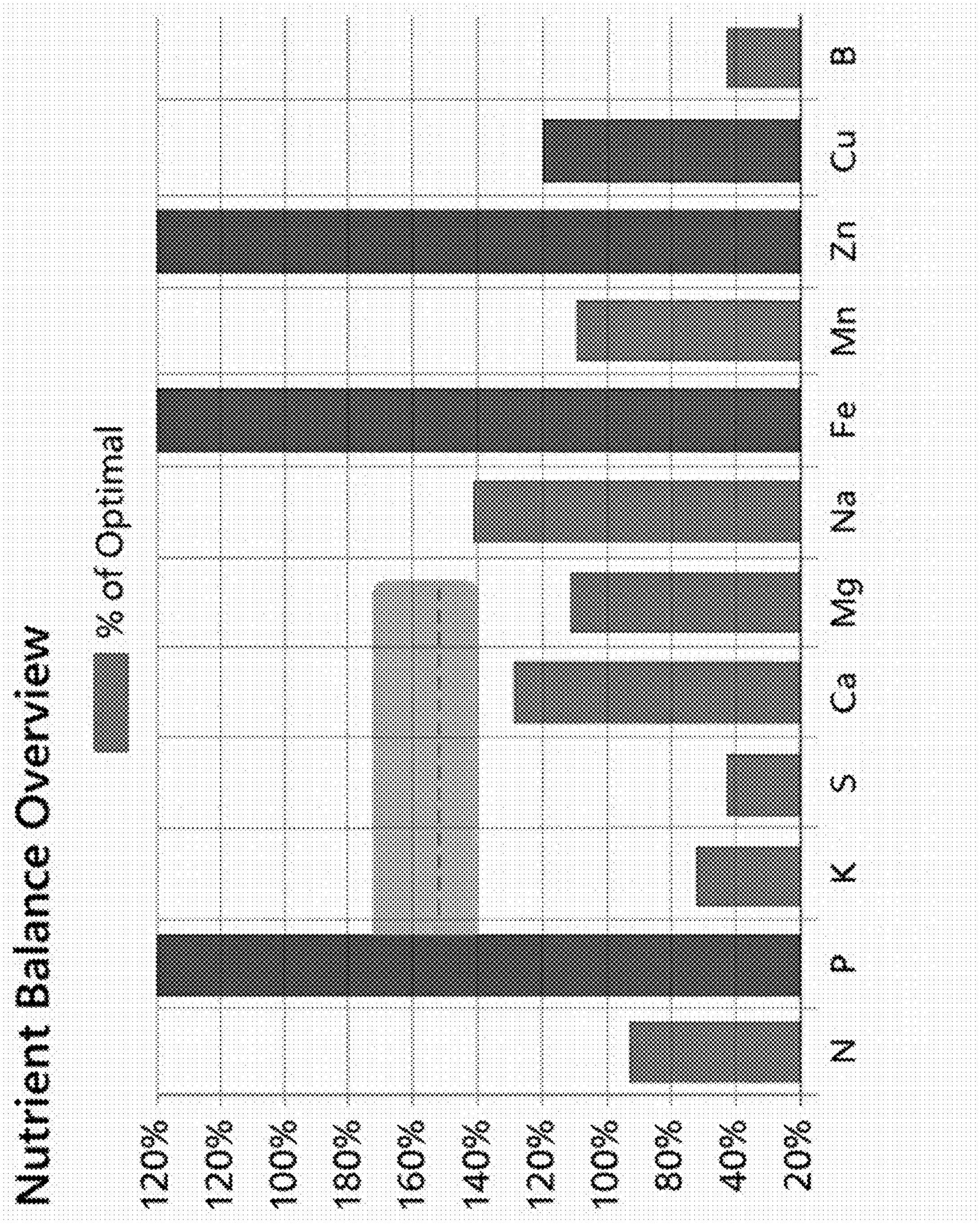
FIG. 8 is an illustrative graph for showing a user's lawn nutrient balance overview, according to aspects of the present disclosure.

FIG. 8 illustrates an example nutrient balance overview graph presented by the system as a visualization of soil test derived nutrient conditions. The nutrient balance overview graph may provide a consolidated view of soil chemistry by showing nutrient sufficiency relative to target ranges and may be used to inform amendment planning and to feed nutrient conditions into weekly task generation.

In aspects, the nutrient balance overview graph may present a bar chart for a defined set of soil parameters and may compute a percentage of optimal for each parameter to enable cross nutrient comparison. The tracked parameters may include pH level, macronutrients nitrogen, phosphorus, and potassium, secondary nutrients calcium, magnesium, and sulfur, micronutrients iron, manganese, zinc, copper, and boron, and sodium to indicate salinity related conditions. Nutrient values may be stored in parts per million, and the interface may convert values into percentage of optimal values for display.

In aspects, the graph may include status indicators that classify each parameter as deficient, adequate, or excessive relative to an optimal range. The graph may include an optimal reference line or target band to anchor interpretation, and the nutrient listing may be scrollable to accommodate the full tracked set. The interface may support selection of an individual nutrient row or bar to open a detailed view that presents the measured value, the optimal range, and a recommended action summary.

In aspects, nutrient balance overview may include color-coded status indicators. For example, the status indicator colors may include: red bars=critically high or low nutrient values, yellow bars=high or low nutrient values, and green bars=adequate (within optimal range), and orange bars=excessive (above optimal range). Horizontal reference line showing optimal percentage, and/or a scrollable nutrient grid with detailed per-nutrient analysis.

In aspects, the nutrient balance overview may be generated after a soil test report is uploaded and parsed. The upload workflow may accept multiple formats including PDF and image formats, and the system may extract nutrient values using optical character recognition and pattern matching. Extracted values may be associated with confidence scores, and the interface may allow a user to review and correct extracted values before saving. The system may also detect or accept a user selection of the source laboratory and may apply laboratory specific interpretation ranges so optimal targets align with the lab's extraction method.

In aspects, the nutrient balance overview may support zone association and historical tracking. A soil test may be linked to an entire property, a management group, or to a management zone, and the interface may include a selector that switches the view between a property aggregation and a selected zone. The system may store multiple tests per property and may provide historical comparisons showing nutrient changes over time and progress toward optimal ranges.

The system may include a native iOS and Android client that mirrors core platform functions while enabling in-field operation. The client may support offline access to zone maps, schedules, task lists, and saved calculation outputs, and may perform bidirectional synchronization that uploads locally generated events and computation results when network connectivity is restored. The system may also provide a notification layer that generates time-sensitive alerts based on stored task windows and forecast-driven conditions, including reminders for scheduled actions and warnings for weather-constrained application periods.

The system may support geospatial field capture for defining and refining management zones. Using device GPS, the client may record a walked perimeter and may convert the captured track into a closed polygon representing a zone boundary, including smoothing and simplification routines to reduce noise and produce a stable geometry. Captured polygons may be stored with geographic coordinates and may be associated with zone identifiers so that soil parameters, imagery-derived indices, treatment history, and task recommendations may be computed and displayed on a per-zone basis.

The system may include camera-based ingestion and analysis functions to incorporate additional field data into the zone model. Captured images may be associated with a selected zone and may be stored with timestamps and location metadata as progress documentation. The system may execute image analysis to classify visible turf conditions, weeds, or disease indicators and may produce structured outputs that feed corrective-action logic. The client may also capture and parse soil test documents by extracting nutrient values and pH measurements from scanned reports, then may store the extracted parameters with confidence scores and may link the results to one or more zones.

The system may further provide wearable and voice interfaces that expose operational status and task execution controls without requiring continuous manual interaction with the client. A wearable interface may display a lawn-health score, zone status summaries, and a next pending high-priority task, while a voice interface may retrieve task lists, record completion events, and log notes during field work. These interfaces may write user confirmations and completion signals back into the system so stored task state and learning models may incorporate verified outcomes.

The system may include an augmented reality visualization layer that renders stored geospatial zone boundaries and associated zone metadata as overlays on a live camera view. The augmented reality layer may align a digital lawn map to the physical environment using device pose estimation, GPS, and inertial sensors, enabling visualization of zone boundaries, historical treatment locations, and zone-level condition indicators derived from soil data, imagery-derived indices, or forecast-driven stress models. The augmented reality output may be used as an operational interface for confirming zone selection, documenting localized issues, and reviewing treatment history in situ.

The system may implement mobile-specific computation and synchronization routines to preserve deterministic outputs across devices. Zone calculations performed offline, including amendment quantities, fertilizer rates, and irrigation adjustments, may be stored as structured records with inputs, units, versioned calculation parameters, and derived results. Upon synchronization, the system may resolve conflicts using timestamp ordering, record versioning, or zone-level locking to maintain data integrity across web and mobile clients.

In aspects, the system may include a lawn playbook configured to provide educational side of the lawn intelligence background tailored to each USDA zone, powered by the JSON files.

In aspects, the system may include a dynamic calendar for monthly, seasonal tasks broken down by category (e.g., planning, fertilizing, overseeding, and dethatching).

In aspects, the system may include one on one consulting using either video chat or in person.

In aspects, the system may enable users to manage multiple properties, for example, lawn companies, golf courses, corporate buildings, and/or wealthy mansions.

The described system provides a tangible and technologically grounded application by integrating imagery analysis, soil diagnostics, and environmental forecasting into a unified computational framework that directly controls physical irrigation and fertilization equipment. Through this integration, the system transforms raw environmental data into actionable control signals that automatically adjust water and nutrient delivery in real time. The machine-learning component continuously refines these operations based on feedback from soil sensors and updated imagery, resulting in measurable improvements in turf health, water conservation, and nutrient efficiency. This dynamic feedback loop enables the technology to operate autonomously in a physical environment, producing concrete outcomes such as reduced runoff, optimized fertilizer and other chemical application use, and consistent lawn appearance that go beyond abstract data processing. The disclosed features therefore provide a practical implementation of adaptive lawn management that achieves a specific and useful technological improvement over conventional static controllers.

It will be understood that various modifications may be made to the aspects and features disclosed herein. Therefore, the above description should not be construed as limiting, but merely as exemplifications of various aspects and features. Those skilled in the art will envision other modifications within the scope and spirit of the claims appended thereto.

What is claimed is:

1. A lawn intelligence management system, comprising:
- a processor; and
- a memory storing computer-executable instructions which, when executed by the processor, cause the system to:
  - access imagery data corresponding to a geographic region from at least one satellite or aerial imagery source;
  - generate a digital lawn map of the geographic region based on the imagery data, including automatically identifying lawn boundaries and subdividing the lawn into a plurality of management zones based on one or more image-derived characteristics;
  - receive soil data associated with at least one of the management zones, the soil data including nutrient composition, macro and micro-nutrient composition, and pH level;

determine corrective actions for the soil data using a soil-correction model that predicts nutrient adjustments for each management zone based on historical soil data, weather data, and applied treatments;

compute fertilizer application parameters for each management zone using a dynamic fertilizer-optimization algorithm configured to maintain nutrient ratios within predefined thresholds;

determine one or more action alerts based on weather forecast data, the one or more action alerts comprising at least watering or fertilization actions based on predicted temperature, precipitation, and evapotranspiration conditions;

control or transmit control signals to an irrigation subsystem to adjust watering schedules in response to the action alerts and the fertilizer application parameters; and update a user-specific machine-learning model using feedback data comprising soil condition updates, imagery changes, or user confirmations, wherein a model refines subsequent soil corrections and watering schedules based on the feedback data.

2. The system of claim 1, wherein generating the digital lawn map comprises applying perspective correction and contrast normalization to the imagery data prior to identifying the lawn boundaries.

3. The system of claim 1, wherein subdividing the lawn into management zones comprises performing image segmentation using vegetation-index values computed from multispectral imagery.

4. The system of claim 1, wherein the soil-correction model generates predicted nutrient trajectories using time-series forecasting and dynamically adjusts corrective recommendations in response to changing weather forecasts.

5. The system of claim 1, wherein the dynamic fertilizer-optimization algorithm employs constraint-based optimization to maintain target nitrogen-phosphorus-potassium ratios while minimizing total fertilizer mass.

6. The system of claim 1, wherein the action alerts are prioritized according to a calculated lawn-stress index derived from weather and soil-moisture variables.

7. The system of claim 1, further comprising a user interface configured to display the digital lawn map with overlaid management zones, soil parameters, and recommended actions.

8. The system of claim 1, wherein the machine-learning model implements reinforcement learning that rewards nutrient uniformity and penalizes excess water or fertilizer application over time.

9. A computer-implemented method for managing lawn care, comprising:

accessing imagery data corresponding to a geographic region from at least one satellite or aerial imagery source;

generating a digital lawn map of the geographic region based on the imagery data, including automatically identifying lawn boundaries and subdividing the lawn into a plurality of management zones based on one or more image-derived characteristics;

receiving soil data associated with at least one of the management zones, the soil data including nutrient composition, macro and micro-nutrient composition, and pH level;

determining corrective actions for the soil data using a soil-correction model that predicts nutrient adjustments for each management zone based on historical soil data, weather data, and applied treatments;

computing fertilizer application parameters for each management zone using a dynamic fertilizer-optimization algorithm configured to maintain nutrient ratios within predefined thresholds;

receiving weather forecast data and determining one or more action alerts comprising at least watering or fertilization actions based on predicted temperature, precipitation, and evapotranspiration conditions;

controlling or transmitting control signals to an irrigation subsystem to adjust watering schedules in response to the action alerts and the fertilizer application parameters; and updating a user-specific machine-learning model using feedback data comprising soil condition updates, imagery changes, or user confirmations, wherein the model refines subsequent soil corrections and watering schedules based on the feedback data.

10. The method of claim 9, further comprising displaying the digital lawn map with visual overlays identifying the management zones and corresponding nutrient or moisture levels.

11. The method of claim 9, wherein generating the digital lawn map comprises performing image segmentation based on normalized difference vegetation index values derived from the imagery data.

12. The method of claim 9, wherein determining corrective actions comprises executing a predictive model trained on historical lawn datasets to forecast nutrient imbalance and recommend application timing.

13. The method of claim 9, further comprising receiving real-time soil-moisture sensor data from a plurality of in-ground probes and incorporating the data into the determination of the action alerts.

14. The method of claim 9, wherein computing fertilizer application parameters comprises optimizing nutrient concentration values under environmental compliance constraints to reduce runoff potential.

15. The method of claim 9, further comprising automatically scheduling an irrigation event when an upcoming weather forecast exceeds a threshold heat index and soil moisture is below a defined value.

16. The method of claim 9, wherein updating the machine-learning model comprises adjusting feature weights according to measured outcomes of prior fertilizer and irrigation actions.

17. The method of claim 9, wherein the user-specific machine-learning model is trained using reinforcement signals representing lawn color uniformity, soil-nutrient stability, and water-use efficiency.

18. The method of claim 9, further comprising generating a lawn-health score for each management zone based on combined imagery, soil, and weather features, and using the score to trigger the action alerts.

19. The method of claim 9, wherein the determining of the action alerts further comprises ranking potential actions by predicted improvement in the lawn-health score relative to resource consumption.

20. A non-transitory computer-readable medium storing computer-executable instructions that, when executed by one or more processors, cause a computing system to perform a method comprising:

accessing imagery data corresponding to a geographic region from at least one satellite or aerial imagery source;

generating a digital lawn map of the geographic region based on the imagery data, including automatically identifying lawn boundaries and subdividing the lawn into a plurality of management zones based on one or more image-derived characteristics;

receiving soil data associated with at least one of the management zones, the soil data including nutrient composition, macro and micro-nutrient composition, and pH level;

determining corrective actions for the soil data using a soil-correction model that predicts nutrient adjustments for each management zone based on historical soil data, weather data, and applied treatments;

computing fertilizer application parameters for each management zone using a dynamic fertilizer-optimization algorithm configured to maintain nutrient ratios within predefined thresholds;

receiving weather forecast data and determining one or more action alerts comprising at least watering or fertilization actions based on predicted temperature, precipitation, and evapotranspiration conditions;

controlling or transmitting control signals to an irrigation subsystem to adjust watering schedules in response to the action alerts and the fertilizer application parameters; and updating a user-specific machine-learning model using feedback data comprising soil condition updates, imagery changes, or user confirmations, wherein the model refines subsequent soil corrections and watering schedules based on the feedback data.

* * * * *